(12) United States Patent
Besterman et al.

(10) Patent No.: US 8,898,979 B2
(45) Date of Patent: Dec. 2, 2014

(54) VISUAL PATTERNING FOR A COVER SYSTEM USING MODULAR UNITS ON A PATTERNED BACKING

(75) Inventors: Paula Besterman, Cary, NC (US); Aaron R. Cox, Tucson, AZ (US); Scott R. LaPree, Rochester, MN (US); Michael J. MacPherson, Elgin, MN (US); Mark D. Pfeifer, Owatonna, MN (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 13 days.

(21) Appl. No.: 13/601,867

(22) Filed: Aug. 31, 2012

(65) Prior Publication Data

US 2014/0062275 A1  Mar. 6, 2014

(51) Int. Cl.
*E04F 13/00* (2006.01)

(52) U.S. Cl.
USPC .............................. 52/311.2; 52/38; 312/223.2

(58) Field of Classification Search
CPC .......... G06F 1/181; G11B 33/02; H05K 7/18; B01D 2265/028; E06B 2003/7011
USPC .......... 52/38, 311.2; 312/223.1, 223.2, 265.5, 312/265.6, 213; 361/695
See application file for complete search history.

(56) References Cited

U.S. PATENT DOCUMENTS

| | | | | |
|---|---|---|---|---|
| 4,661,888 A * | 4/1987 | Jewell et al. | ................... | 361/818 |
| 5,323,299 A * | 6/1994 | Weber | ........................... | 361/818 |
| 5,542,757 A * | 8/1996 | Chang | ........................ | 312/223.2 |
| 5,544,012 A * | 8/1996 | Koike | ............................. | 361/695 |
| 5,547,272 A * | 8/1996 | Paterson et al. | ............. | 312/223.2 |
| 5,791,752 A * | 8/1998 | Hartman | ........................ | 312/204 |
| 5,884,988 A * | 3/1999 | Foo et al. | ..................... | 312/223.2 |
| 5,935,282 A * | 8/1999 | Lin | ............................... | 55/385.6 |
| 5,948,498 A * | 9/1999 | Bianco et al. | .................... | 428/81 |
| 6,147,304 A * | 11/2000 | Doherty | ........................ | 174/481 |
| 6,234,593 B1 * | 5/2001 | Chen et al. | .................. | 312/223.2 |
| 6,370,037 B1 * | 4/2002 | Schoenfish | .................... | 361/807 |
| 6,392,879 B1 * | 5/2002 | Chien | ........................ | 361/679.33 |
| 6,775,132 B2 * | 8/2004 | Chen et al. | ............... | 361/679.33 |
| 7,009,838 B2 * | 3/2006 | Roh | .......................... | 361/679.32 |
| 7,061,756 B2 * | 6/2006 | Wu | .............................. | 361/679.33 |
| 7,735,792 B1 * | 6/2010 | White | ........................ | 248/220.43 |
| 7,784,738 B1 * | 8/2010 | Landes et al. | ............... | 244/129.4 |
| 2009/0021126 A1 * | 1/2009 | Chou et al. | ................... | 312/223.1 |
| 2010/0188597 A1 * | 7/2010 | Koike et al. | ...................... | 349/58 |
| 2013/0094130 A1 * | 4/2013 | Yang et al. | ............... | 361/679.02 |
| 2013/0119836 A1 * | 5/2013 | Liang | ........................... | 312/223.1 |

OTHER PUBLICATIONS

Design U.S. Appl. No. 29/431,029, filed Aug. 31, 2012.

* cited by examiner

*Primary Examiner* — Basil Katcheves
*Assistant Examiner* — Joshua Ihezie
(74) *Attorney, Agent, or Firm* — Zilka-Kotab, PC (57) ABSTRACT

A modular panel unit according to one embodiment includes a major subunit adapted for being secured to a keyed backing panel, and at least one minor subunit. The major subunit includes at least one connector adapted for coupling to a corresponding connection feature of the keyed backing panel in order to secure the major subunit to the keyed backing panel; and one or more coupling features. Each minor subunit includes: one or more couplers adapted for coupling to the one or more coupling features of the major subunit in order to secure the minor subunit to the major subunit. Additional systems and methods are also disclosed.

20 Claims, 7 Drawing Sheets

VISUAL PATTERNING FOR A COVER SYSTEM USING MODULAR UNITS ON A PATTERNED BACKING

BACKGROUND

The present invention relates to visual patterning, and more particularly, to an efficient to assemble covering system using modular units on a patterned backing Many electronic computing systems are stored in racks, storage cabinets, or other types of enclosures. These enclosures generally have a door suitable for accessing at least one side of the enclosure, often the front of the enclosure. These doors may be plain or may have some sort of design or patterning included thereon. Typically, these designs or patterns are specific to the type of enclosure, a manufacturer of the enclosure, a manufacturer of the computing system within the enclosure, a model or type of the computing system within the enclosure, contents of the enclosure, or some combination thereof.

Manufacturers of computing systems will often indicate that a system is manufactured by them by designing a distinguishing door to cover an enclosure in which they sell their computing systems. One way of distinguishing the door is to provide a unique pattern for the door. In order to prepare these patterned doors for use on these enclosures, manufacturers typically are required to either fabricate one or more large, specialized pieces to cover the door, or manufacture a plurality of small pieces which must be attached to a universal grid or backing secured to the door. These small pieces must be attached in a specific orientation, otherwise the pattern will not be consistent from one product to the next.

Accordingly, in order to reduce assembly errors and to reduce manufacturing costs, a more efficient method of providing patterned doors for enclosures would be beneficial to these computing systems manufacturers.

BRIEF SUMMARY

A modular panel unit according to one embodiment includes a major subunit adapted for being secured to a keyed backing panel, and at least one minor subunit. The major subunit includes at least one connector adapted for coupling to a corresponding connection feature of the keyed backing panel in order to secure the major subunit to the keyed backing panel; and one or more coupling features. Each minor subunit includes: one or more couplers adapted for coupling to the one or more coupling features of the major subunit in order to secure the minor subunit to the major subunit.

A system according to one embodiment includes a keyed backing panel comprising a plurality of connection features oriented to cause modular panel units coupled thereto to form a predetermined pattern; and a plurality of modular panel units adapted for coupling to the keyed backing panel. Each modular panel unit includes a major subunit adapted for being secured to the keyed backing panel, and a minor subunit. The major subunit includes at least one connector adapted for coupling to a corresponding connection feature of the keyed backing panel in order to secure the major subunit to the keyed backing panel, and one or more coupling features. The minor subunit includes one or more couplers adapted for coupling to the one or more coupling features of the major subunit in order to secure the minor subunit to the major subunit.

A method for creating a patterned panel according to one embodiment includes creating or receiving a keyed backing panel having a plurality of positions capable of having a modular panel unit installed thereon, each position comprising at least one connection feature, wherein the connection features are oriented to cause modular panel units coupled thereto to form a predetermined pattern; and coupling modular panel units to the keyed backing panel to form the predetermined pattern.

Other aspects and embodiments of the present invention will become apparent from the following detailed description, which, when taken in conjunction with the drawings, illustrates by way of example the principles of the invention.

DETAILED DESCRIPTION

The following description is made for the purpose of illustrating the general principles of the present invention and is not meant to limit the inventive concepts claimed herein. Further, particular features described herein can be used in combination with other described features in each of the various possible combinations and permutations.

Unless otherwise specifically defined herein, all terms are to be given their broadest possible interpretation including meanings implied from the specification as well as meanings understood by those skilled in the art and/or as defined in dictionaries, treatises, etc.

It must also be noted that, as used in the specification and the appended claims, the singular forms "a," "an," and "the" include plural referents unless otherwise specified.

In one general embodiment, a modular panel unit includes a major subunit adapted for being secured to a keyed backing panel, and at least one minor subunit. The major subunit includes at least one connector adapted for coupling to a corresponding connection feature of the keyed backing panel in order to secure the major subunit to the keyed backing panel; and one or more coupling features. Each minor subunit includes: one or more couplers adapted for coupling to the one or more coupling features of the major subunit in order to secure the minor subunit to the major subunit.

In another general embodiment, a system includes a keyed backing panel comprising a plurality of connection features oriented to cause modular panel units coupled thereto to form a predetermined pattern; and a plurality of modular panel units adapted for coupling to the keyed backing panel. Each modular panel unit includes a major subunit adapted for being secured to the keyed backing panel, and a minor subunit. The major subunit includes at least one connector adapted for coupling to a corresponding connection feature of the keyed backing panel in order to secure the major subunit to the keyed backing panel, and one or more coupling features. The minor subunit includes one or more couplers adapted for coupling to the one or more coupling features of the major subunit in order to secure the minor subunit to the major subunit.

In one general embodiment, a method for creating a patterned panel according to one embodiment includes creating or receiving a keyed backing panel having a plurality of positions capable of having a modular panel unit installed thereon, each position comprising at least one connection feature, wherein the connection features are oriented to cause modular panel units coupled thereto to form a predetermined pattern; and coupling modular panel units to the keyed backing panel to form the predetermined pattern.

Figure 1:
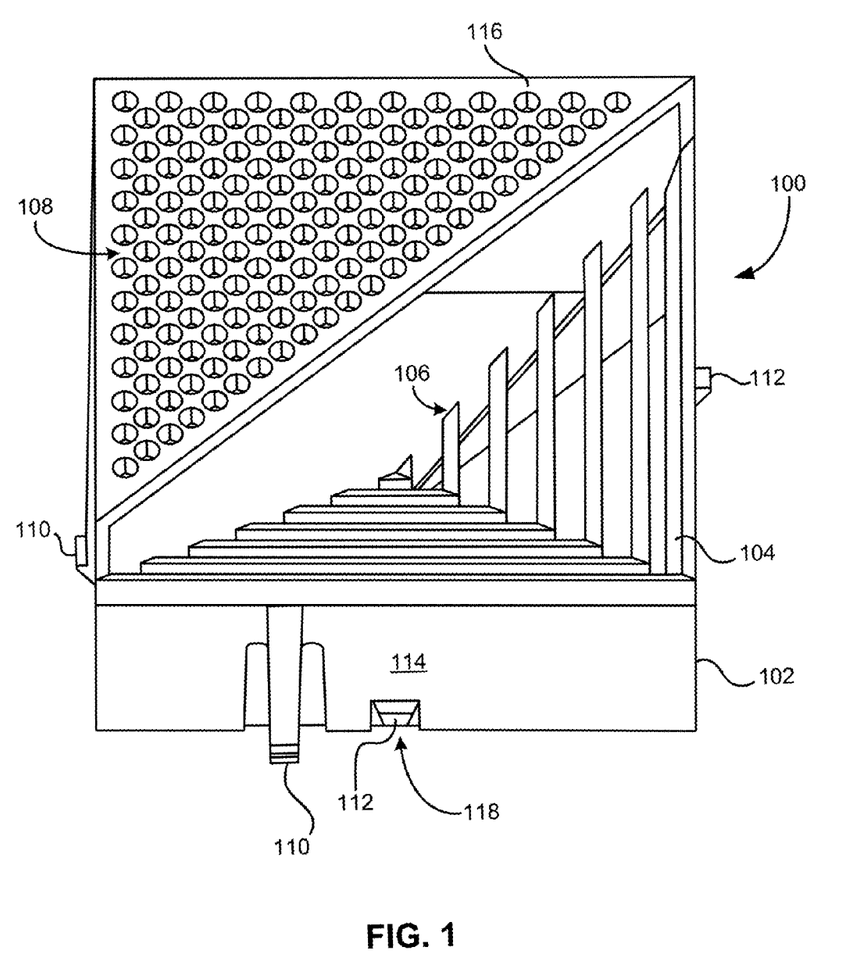
FIG. 1 shows a modular panel unit, according to one embodiment.

Referring to FIG. 1, a modular panel unit 100 is shown, according to one embodiment. The modular panel unit 100 may comprise one or more subunits 102, 104 adapted for being secured to a keyed backing panel (not shown), such as two panel subunits (as shown), three panel subunits, four panel subunits, etc. Each panel subunit may have a different appearance and/or function. The appearance differences between the subunits may be structural (shape, material used, strength, weight, purpose, etc.), cosmetic (such as color, surface roughness, reflectivity, material, etc.), or any other differences that may be imparted to subunits of a modular panel unit 100.

As shown in FIG. 1, the modular panel unit 100 comprises multiple subunits, a major subunit 102 and one or more minor subunits 104. The major subunit 102 is depicted as a square-based shape having a triangular-shaped portion. However, any desired shapes and structures may be used, as long as the major subunit 102 is adapted to be secured to the keyed backing panel. Some exemplary shapes include, but are not limited to, polygons (including rectangles, triangles, diamonds, octagons, etc.), circles, ellipses, irregular shapes, three-dimensional shapes, business or organizational-specific shapes (such as logos, company characters, product shapes, slogans, etc.)

The major subunit 102 includes an upper portion 116 having a plurality of perforations 108 therein, and a lower portion 114 adapted for being secured to the keyed backing panel. The plurality of perforations 108 allow for airflow through the perforations (to cool any computing systems therebehind when installed on the keyed backing panel) while the upper portion 116 provides a surface to convey color or some other structural characteristic for this portion of the panel unit 100. The lower portion 114 provides a structural shape to the major subunit 102, which may be adapted to accept or otherwise interact with the minor subunit(s) 104.

To accomplish the coupling to the keyed backing panel, the major subunit 102 comprises one or more connectors 110 adapted to couple with corresponding connection features on the keyed backing panel. Specifically, as shown in FIG. 1, according to one embodiment, the major subunit 102 comprises four notched connectors 110 adapted to be inserted into corresponding holes in the keyed backing panel, and then to flex into a position which resists removal from the keyed backing panel, due to friction and/or mechanical interference between parts of the major subunit 102 and the keyed backing panel. In one embodiment, the portion that is inserted into the keyed backing panel is a flexible tip portion of the connector 110 which flexes out of the way of a portion of the keyed backing panel upon insertion, and then flexes back into a resting position. In this resting position, a portion of the flexible tip portion resides behind a portion of the keyed backing panel, to resist removal therefrom.

In accordance with one embodiment, and as will be explained in more detail later, the connectors 110 on the major subunit 102 are distributed along edges of the major subunit 102 such that the keyed backing panel may be designed to secure each major subunit in only one orientation. For example, since the major subunit 102 is square-based in FIG. 1, in one embodiment, there may be four ways of securing the modular panel unit 100 to the keyed backing panel, with the minor subunit 104 oriented in an upper right corner, in a lower right corner, in a lower left corner, or in an upper left corner. Of course, any other orientation therebetween is also possible, along with having the modular panel units 100 protruding or recessed from the keyed backing panel, tilted at differing angles, etc. However, the concept here is that when one or more modular panel units 100 are secured to the keyed backing panel during assembly, each modular panel unit 100 is capable of being secured in only one orientation at any given position on the keyed backing panel. This is what makes the backing panel "keyed."

The major subunit 102 also comprises one or more coupling features 118 adapted to allow corresponding couplers 112 on the minor subunit 104 to couple thereto. In one embodiment, the coupler 112 may be a protrusion designed to engage a notch 118 on the major subunit 102. In this way, the minor subunit 104 is adapted to be coupled to the major subunit 102, before or after coupling the major subunit 102 to the keyed backing panel.

In FIG. 1, two coupling features 118 (specifically notches) are visible, but more or less may be included, such as one notch, four notches, etc. In addition, it is not necessary to have notches, as any coupling method may be used to couple the major subunit 102 and the minor subunit(s) 104 together. In another embodiment, the major subunit 102 and minor subunit(s) 104 may be secured to the keyed backing panel without being secured to one another.

The minor subunit 104, as shown in FIG. 1, also comprises a pattern of slats separated by slots 106. This pattern allows for airflow through the slots and provides a surface to project color or some other design characteristic in this portion of the panel unit 100.

Figure 2:
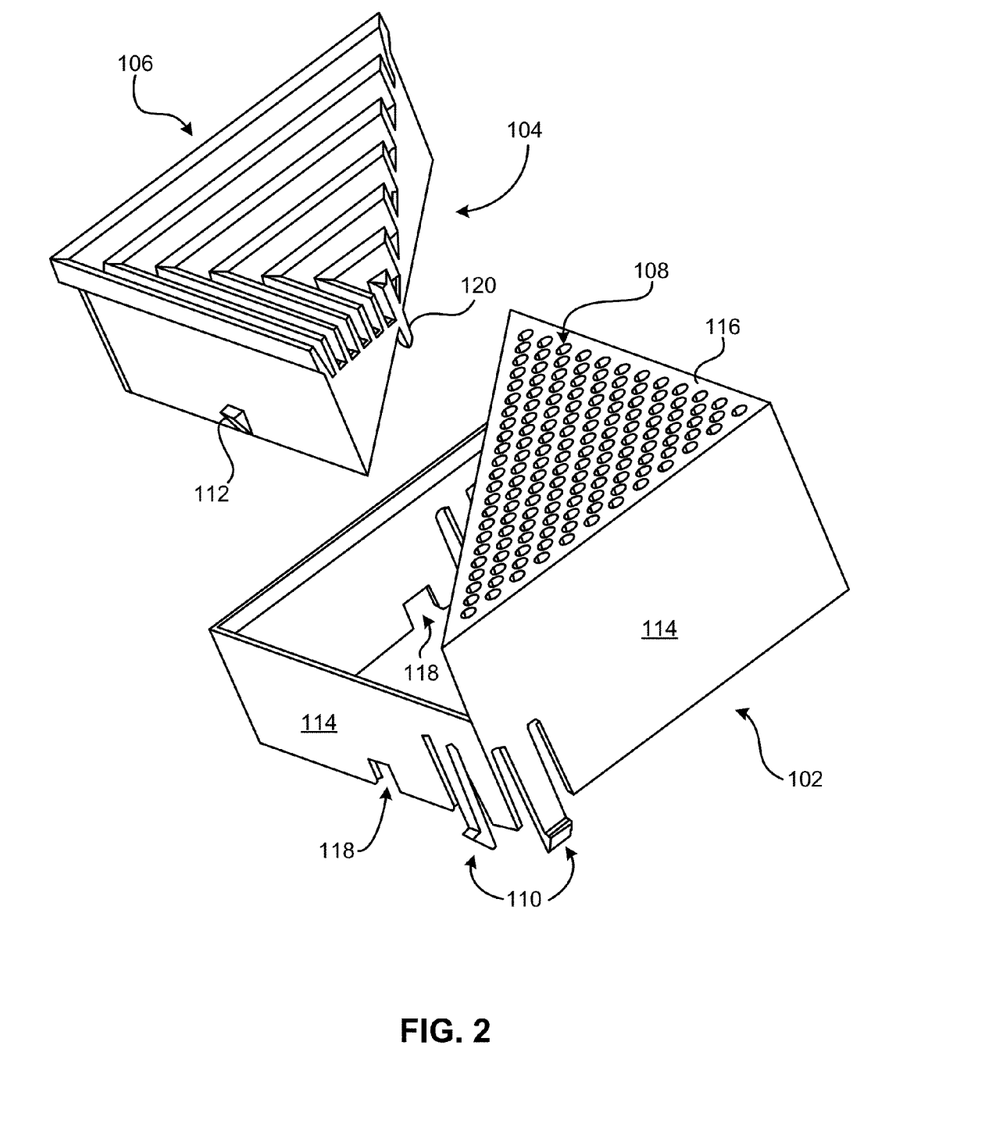
FIG. 2 shows an exploded view of a modular panel unit, according to one embodiment.

Now referring to FIG. 2, an exploded view of a modular panel unit 100 is shown according to one embodiment. The major subunit 102 is shown below the minor subunit 104. More than one minor subunit 104 (having a different size and shape than the one shown in FIGS. 1-2) may be coupled to the major subunit 102, such as two, three, four, etc. In addition, the major subunit 102 and the minor subunit(s) 104 may be the same or almost the same, with differing patterns thereon, e.g., there may be one shaped subunit, but different patterns, colors, shapes, etc., included in each subunit.

As shown in FIG. 2, the minor subunit 104 comprises at least one coupler 112 adapted for coupling to a coupling feature 118 or other suitable portion of the lower portion 114 of the major subunit 102. In this exemplary embodiment, the minor subunit 104 simply "snaps" into the major subunit 102 to couple the subunits together using a protrusion and a corresponding notch. However, any suitable coupling feature and coupler may be used, as would be understood by one of skill in the art upon reading the present descriptions.

In addition, the minor subunit 104 may include one or more support members 120 which engage(s) a corresponding portion of the major subunit 102 to provide structural support to the minor subunit 104. For example, this may ensure that a user or device is not accidentally pushed through the minor subunit 104 or major subunit 102, as this may damage computing systems therebehind.

In addition, as shown in FIG. 2, the minor subunit 104 may have a profile that does not conform to a single plane, e.g., as shown, it may slant inward toward a center of the modular panel unit 100, or it may slant outward, or it may slant in multiple directions. Furthermore, it may have a pattern or shape which is similar or dissimilar to the major subunit 102, in various embodiments.

In additional approaches, the major and minor subunits may completely cover the area of the modular panel unit 100 or they may leave a gap between edges of the subunits, or between the subunits, or on the subunits themselves, such as to permit airflow therethrough. However, in most embodiments, each modular panel unit 100 restricts movement of objects therethrough to protect any equipment that may be installed behind the modular panel unit 100.

Now referring to FIGS. 1-2, an exemplary modular panel unit 100 is described. The modular panel unit 100 may comprise a major subunit 102 adapted for being secured to a keyed backing panel, the major subunit 102 comprising at least one connector 110 adapted for coupling to a corresponding connection feature of the keyed backing panel in order to secure the major subunit 102 to the keyed backing panel and one or more coupling features 118. It also may comprise at least one minor subunit 104, each minor subunit 104 comprising one or more couplers 112 adapted for coupling to the one or more coupling features 118 of the major subunit 102 in order to secure the minor subunit 104 to the major subunit 102.

In some embodiments, each of the major subunits 102 may comprise a lower portion 114 having a square or rectangular outer profile (the shape of outer edges of the lower portion 114 when viewed from above as would be when looked upon after being mounted to the keyed backing panel) and an upper portion 116 having a triangular outer profile (the shape of outer edges of the upper portion 116 when viewed from above as would be when looked upon after being mounted to the keyed backing panel), the upper portion 116 being supported by and bounded by the outer profile of the lower portion 114.

In more embodiments, the lower portion 114 may comprise the at least one connector 110 adapted for coupling to the corresponding connection feature of the keyed backing panel and the one or more coupling features 118 adapted for coupling to the one or more couplers 112 of the at least one minor subunit 104.

According to another embodiment, the upper portion 116 may comprise a plurality of perforations 108 therein, the perforations 108 being adapted for allowing airflow through the upper portion 116. The perforations 108 may have any pattern, size, shape, or design, as would be known by one of skill in the art, and any number of perforations 108 may be present.

In another embodiment, the minor subunits 104 each may comprise a triangular outer profile bounded by the outer profile of the lower portion 114 of the major subunit 102 and positioned opposite the upper portion 116 of the major subunit 102. Additionally, each minor subunit 104 may comprise a pattern of slats separated by slots (collectively 106), the slots being adapted for allowing airflow through the slots and the slats being adapted for restricting access therethrough.

In one approach, each of the major subunits 102 may comprise two or more connectors 110, the connectors 110 being distributed along edges of each of the major subunits 102 such that the major subunits 102 are capable of being secured to the keyed backing panel in only one orientation at any given position on the keyed backing panel. For example, the connectors may be positioned on all four edges of the major subunits 102, but on each edge they are positioned a different distance from a corner of the major subunits 102. In this way, the keyed backing panel may be designed such that the orientation of the connection features 122 dictates how the major subunits 102 (and accordingly the modular panel units 100) may be coupled to positions on the keyed backing panel 128.

In accordance with another embodiment, the at least one connector 110 of each of the major subunits 102 may comprise a flexible, notched tip which when inserted into a corresponding hole of the keyed backing panel, flexes into a position which resists removal from the keyed backing panel.

In one embodiment, the minor subunits 104 may be adapted to be pushed onto major subunits 102 to establish a coupling therebetween, and the major subunits 102 may be adapted to be pushed onto the keyed backing panel to establish a coupling therebetween in only one orientation at any given position of the keyed backing panel in order to form a predetermined pattern of modular panel units 100.

Figure 3:
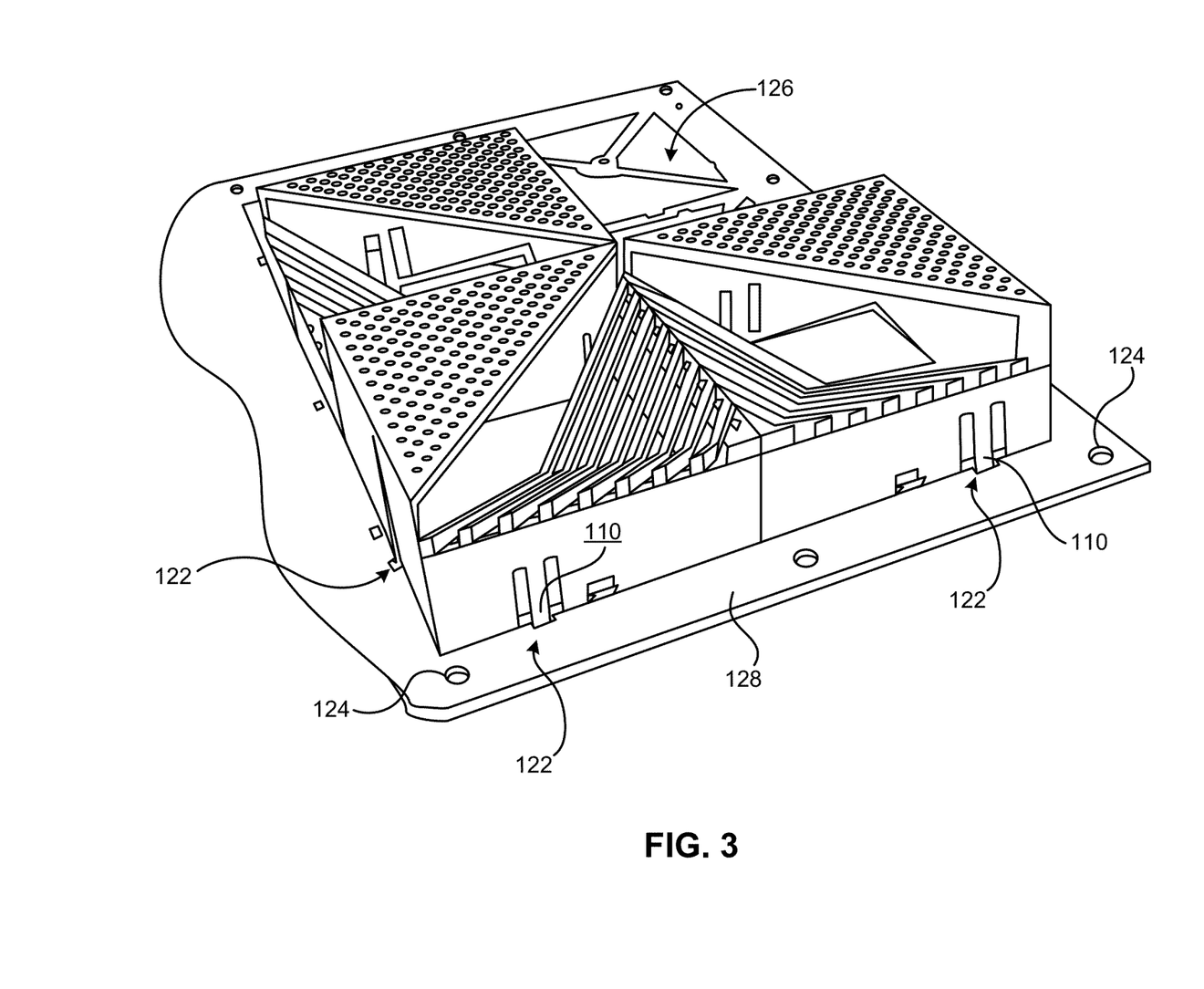
FIG. 3 shows a portion of a keyed backing panel according to one embodiment, with modular panel units coupled thereto.

With reference to FIG. 3, a portion of a keyed backing panel 128 is shown according to one embodiment, with modular panel units 100 coupled thereto. The keyed backing panel 128 comprises a planar or semi-planar portion which has one or more features 124 adapted for securing the keyed backing panel 128 to another keyed backing panel 128 or to some other structure, such as a server cabinet door, a server rack door, electronics equipment cabinet sidewalls, etc. Also, the connection features 122 are adapted for securing the modular panel units 100 to the keyed backing panel 128 using connectors 110 on the modular panel units 100, in one approach.

The keyed backing panel 128 also may comprise a plurality of voids with each void being located at a position capable of having a modular panel unit coupled thereto. Additionally, a cross support 126 may be provided across each void to provide lateral support to the structure, while still allowing airflow therethrough. Of course, other types of supporting structures may be present as would be appreciated by one of skill in the art upon reading the present descriptions.

The keyed backing panel 128 may be constructed of any suitable material, such as any type of plastic, polymer, composite, metal, metal alloy, fiber or weave, etc. In one embodiment, the keyed backing panel 128 may comprise aluminum or an aluminum-based alloy. Furthermore, the keyed backing panel 128 may be coated with a suitable coating, such as paint, rubberizing polymer, anti-static coating, or some other suitable coating known in the art, prior to assembling the plurality of modular panel units 100 thereon.

Figure 4:
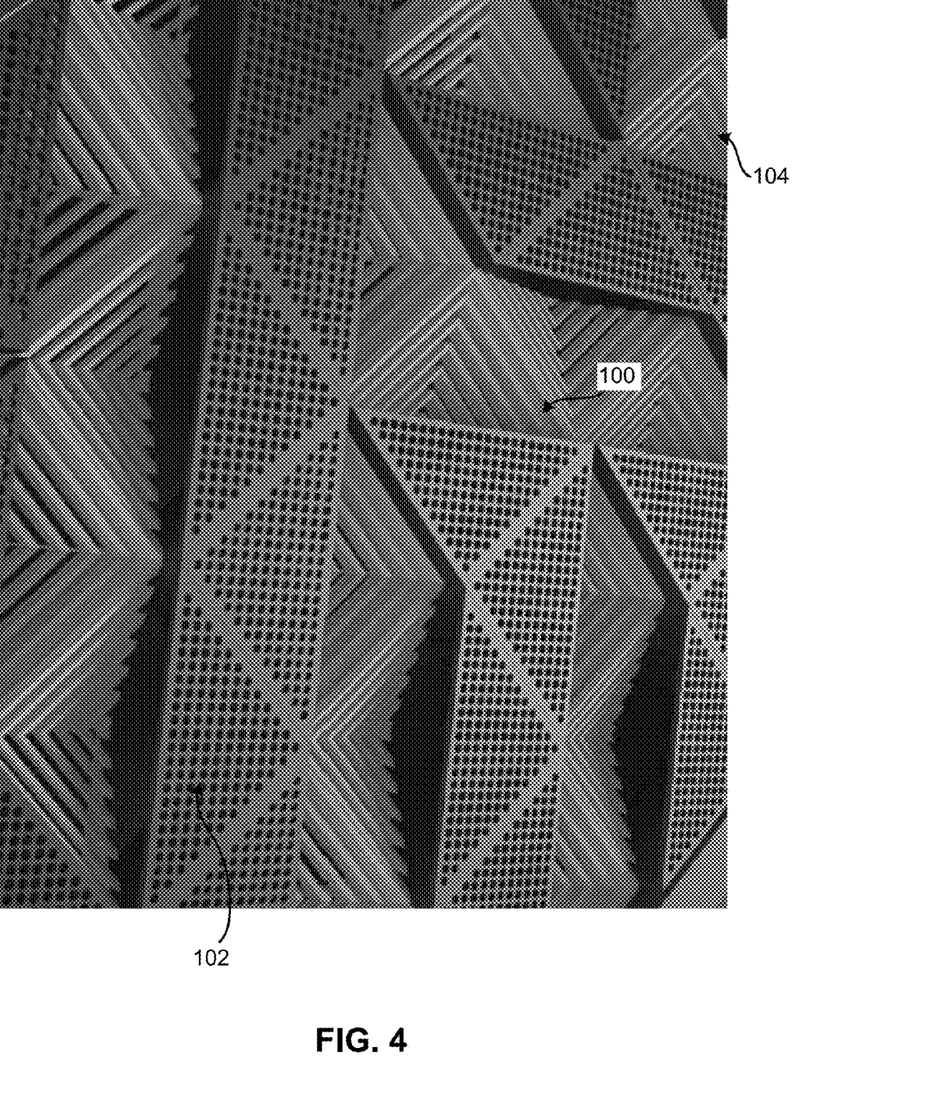
FIG. 4 shows a perspective view of a portion of an exemplary pattern comprising a plurality of modular panel units.

FIG. 4 shows a perspective view of a portion of an exemplary pattern comprising a plurality of modular panel units 100 assembled on a keyed backing panel (not visible). The pattern of the modular panel units 100 is dictated by the keying of the keyed backing panel onto which the modular panel units 100 are assembled. Additional patterns may be created which rely on different keying, where each modular panel unit 100 is only capable of being coupled to the keyed backing panel in one orientation, thereby creating a desired pattern. As shown in FIG. 4, each modular panel unit 100 comprises a major subunit 102 and a minor subunit 104, each of which are oriented according to the orientation of the modular panel unit 100 they are coupled to. In this example, there are four possible orientations for the modular panel units 100, as detailed previously.

In additional embodiments, the modular panel units 100 may have more or less than four possible orientations, depending on the keying of the keyed backing panel and the positioning of the connectors on each modular panel unit 100.

Referring to FIGS. 3-4, according to one embodiment, a system may comprise a keyed backing panel 128 comprising a plurality of connection features 122 oriented to cause modular panel units 100 coupled thereto to form a predetermined pattern (a portion of one such pattern is shown in FIG. 4, according to one embodiment). The system also comprises a plurality of modular panel units 100 adapted for coupling to the keyed backing panel 128. Each modular panel unit 100 comprises a major subunit 102 adapted for being secured to the keyed backing panel 128 and comprising at least one connector 110 adapted for coupling to a corresponding connection feature 122 of the keyed backing panel 128 in order to secure the major subunit 102 to the keyed backing panel 128 and one or more coupling features 118. Each modular panel unit 100 also comprises a minor subunit 104 comprising one or more couplers 112 adapted for coupling to the one or more coupling features 118 of the major subunit 102 in order to secure the minor subunit 104 to the major subunit 102.

In some embodiments, each of the major subunits 102 may comprise a lower portion 114 having a square or rectangular outer profile (the shape of outer edges of the lower portion 114 when viewed from above as would be when looked upon after being mounted to the keyed backing panel 128) and an upper portion 116 having a triangular outer profile (the shape of outer edges of the upper portion 116 when viewed from above as would be when looked upon after being mounted to the keyed backing panel 128), the upper portion 116 being supported by and bounded by the outer profile of the lower portion 114.

In more embodiments, the lower portion 114 may comprise the at least one connector 110 adapted for coupling to the corresponding connection feature 122 of the keyed backing panel 128 and the one or more coupling features 118 adapted for coupling to the one or more couplers 112 of the at least one minor subunit 104.

According to another embodiment, the upper portion 116 may comprise a plurality of perforations 108 therein, the perforations 108 being adapted for allowing airflow through the upper portion 116. The perforations 108 may have any pattern, size, shape, or design, as would be known by one of skill in the art, and any number of perforations 108 may be present.

In another embodiment, the minor subunits 104 each may comprise a triangular outer profile bounded by the outer profile of the lower portion 114 of the major subunit 102 and positioned opposite the upper portion 116 of the major subunit 102. Additionally, each minor subunit 104 may comprise a pattern of slats separated by slots (collectively 106), the slots being adapted for allowing airflow through the slots and the slats being adapted for restricting access therethrough.

In one approach, each of the major subunits 102 may comprise two or more connectors 110, the connectors 110 being distributed along edges of each of the major subunits 102 such that the major subunits 102 are capable of being secured to the keyed backing panel 128 in only one orientation at any given position on the keyed backing panel 128. For example, the connectors may be positioned on all four edges of the major subunits 102, but on each edge they are positioned a different distance from a corner of the major subunits 102. In this way, the keyed backing panel 128 may be designed such that the orientation of the connection features 122 dictates how the major subunits 102 (and accordingly the modular panel units 100) may be coupled to positions on the keyed backing panel 128.

In accordance with another embodiment, the at least one connector 110 of each of the major subunits 102 may comprise a flexible, notched tip which when inserted into a corresponding hole 122 of the keyed backing panel 128, flexes into a position which resists removal from the keyed backing panel 128.

In one embodiment, the minor subunits 104 may be adapted to be pushed onto major subunits 102 to establish a coupling therebetween, and the major subunits 102 may be adapted to be pushed onto the keyed backing panel 128 to establish a coupling therebetween in only one orientation at any given position of the keyed backing panel 128 in order to form a predetermined pattern of modular panel units 100.

The keyed backing panel 128, in one approach, may comprise a planar or semi-planar portion (not indicated but seen as a flat surface in the figures) comprising the plurality of connection features 122 distributed thereacross, a plurality of voids (not indicated but seen as holes or empty spaces in the flat surface in the figures) located at positions capable of having a modular panel unit 100 coupled thereto, and one or more features 124 adapted for securing the keyed backing panel 128 to another structure, such as another backing panel, an enclosure door, a server rack door or side panel, etc.

Furthermore, in some approaches, the keyed backing panel 128 may further comprise cross supports 126 provided across each void to provide lateral support to the keyed backing panel 128. Also, in some embodiments, the keyed backing panel 128 may comprise aluminum or some other metal or rigid material and the modular panel units 100 may comprise thermoplastic or some other easily formed and shaped material.

Figure 5:
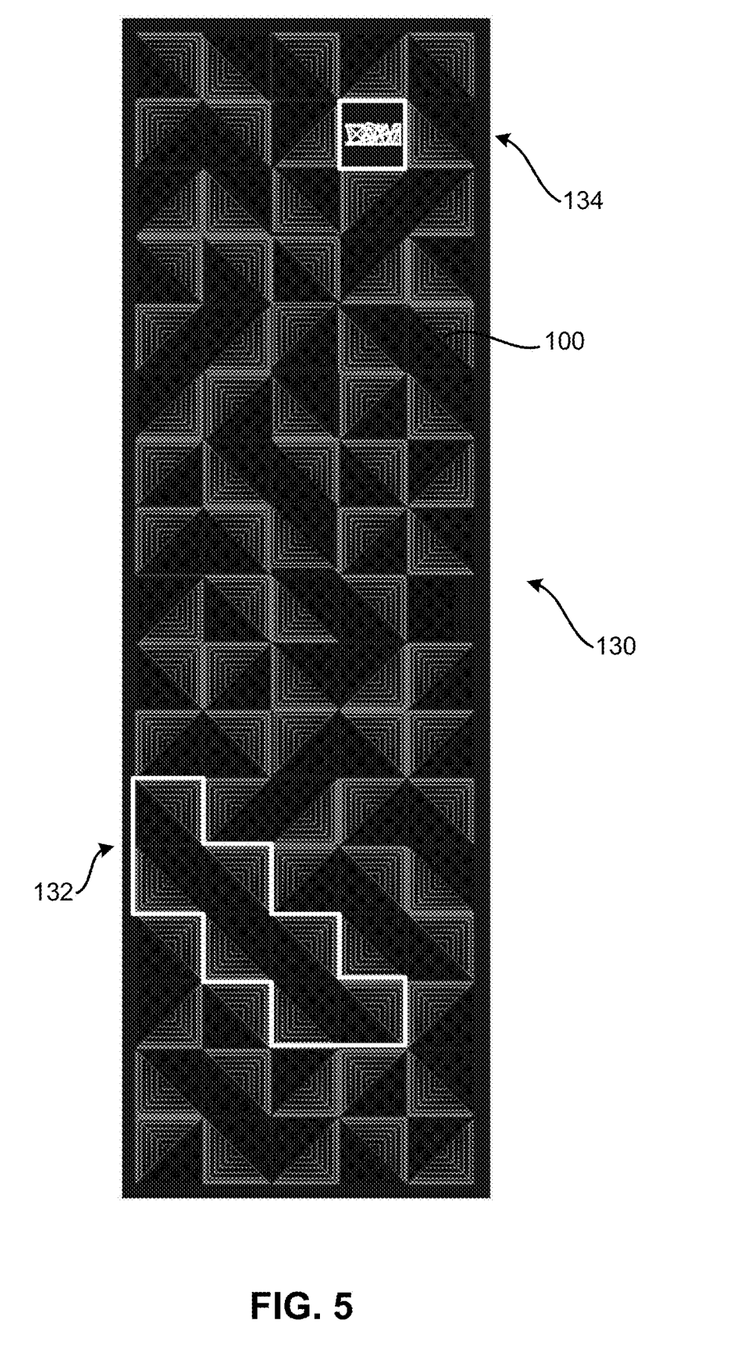
FIG. 5 shows an exemplary pattern formed using modular panel units for an enclosure door, according to one embodiment.

Now referring to FIG. 5, a front view of an exemplary pattern 130 using a plurality of modular panel units 100 arranged according to the keyed backing panel for an enclosure door is shown, according to one embodiment. As would be understood by one of skill in the art, even using only the modular panel units 100 described in detail herein, there are thousands of different ways of locating the modular panel units 100 in a pattern, and therefore each pattern is not being described individually. Instead, it is noted that one benefit of modular panel units 100 is that they may be assembled in many unique patterns using any number of different keyed backing panels. Furthermore, by using different modular panel units 100 than those specifically described herein, thousands upon thousands of other unique patterns are possible using the embodiments described herein.

It is also noted that certain portions of the keyed backing panel (not visible) may have structural characteristics unique to only portions of the keyed backing panel. For example, portion 132 may not be a collection of modular panel units 100. Instead, portion 132 may be a solid, rigid, or semi-rigid member which is capable of displaying a name, model, type, or some other identifying text, numbering, or symbol for the computing system represented by the pattern 130. For example, if the pattern 130 represents a server rack, the portion 130 may display a name of the server.

In another embodiment, a portion 134 may not comprise a modular panel unit 100. The portion 134 may include a name, symbol, trademark, or other distinguishing mark of a company or organization which built or manufactured the computing device housed within the enclosure. For example, if the server is manufactured by IBM, portion 134 may include IBM's trademark.

Although portion 132 and portion 134 are shown in specific locations in the pattern 130, they may be located anywhere and may be any size or shape. For example, each portion may include the space equivalent to one or more modular panel unit 100, and may resemble the modular panel units 100 or may have a different appearance entirely.

Figure 6:
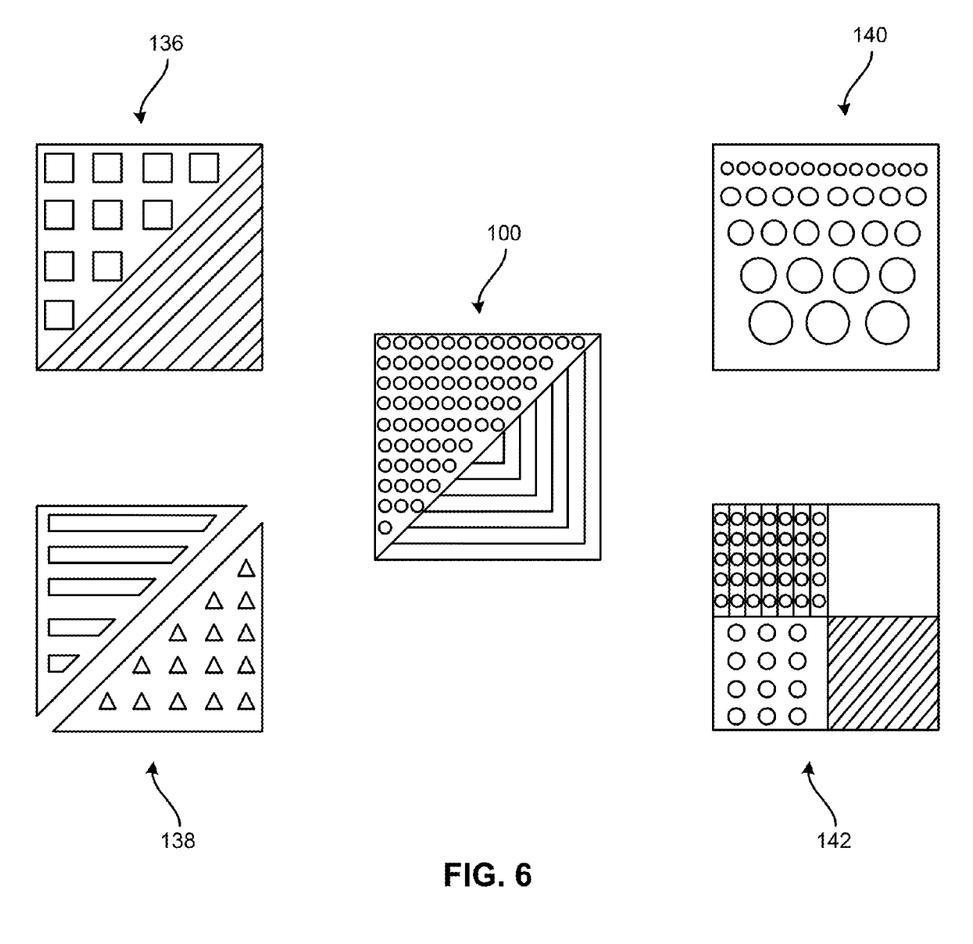
FIG. 6 shows several exemplary modular panel units according to various embodiments.

Now referring to FIG. 6, several exemplary modular panel units 136, 138, 140, and 142 are shown according to various embodiments. Different shapes, structures, and sizes of modular panel units may be used, as long as they correspond to a keyed backing panel. Modular panel unit 136 shows square, rectangular, or otherwise polygonal perforations as opposed to circular or elliptical perforations shown in modular panel unit 100. Modular panel unit 138 shows longitudinal slots instead of perforations along with larger polygonal perforations on the major subunit as opposed to the minor subunit, as shown in modular panel unit 100. Modular panel unit 140 shows a single subunit as opposed to multiple subunits as shown in modular panel unit 100, along with circular or elliptical perforations that vary in size instead of having the same size, as in modular panel unit 100. Modular panel unit 142 shows four subunits as opposed to two subunits as shown in modular panel unit 100, each subunit having a different venting pattern. Of course, one of skill in the art, using the descriptions herein, may envision thousands of other possible combinations and appearances for the modular panel units, all of which may be used in the embodiments described herein.

Figure 7:
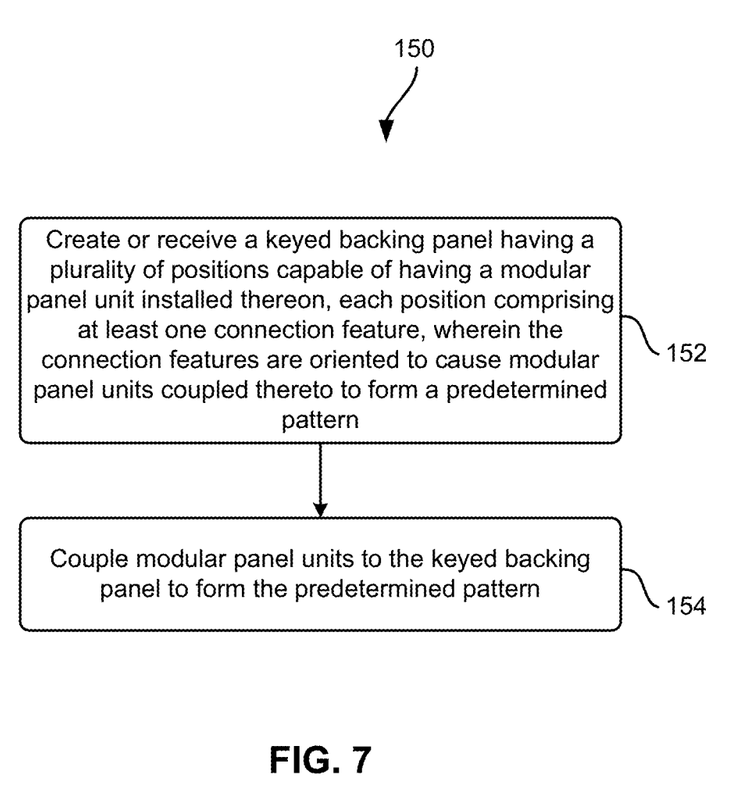
FIG. 7 shows a flowchart of a method, according to one embodiment.

Now referring to FIG. 7, a method 150 for creating a patterned panel is shown according to one embodiment. The method 150 may be executed in any desired environment, including those depicted and described in FIGS. 1-6, according to various embodiments. In addition, more or less operations than those specifically described herein may be included n method 150 according to additional approaches.

As shown in FIG. 7, method 150 begins with operation 152, where a keyed backing panel is created or received. The keyed backing panel includes a plurality of positions capable of having a modular panel unit installed thereon. Additionally, each position comprises at least one connection feature, with the totality of the connection features being oriented to cause modular panel units coupled thereto to form a predetermined pattern. It is this pattern which is created using the modular panel units installed on the keyed backing panel.

In one approach, each of the modular panel units may be installed or coupled to the keyed backing panel in only one orientation at any given position on the keyed backing panel, thereby ensuring that the modular panel units may not be improperly installed, and the desired pattern is produced. Furthermore, different desired patterns may be created by receiving or creating a keyed backing panel having a different arrangement of connection features at each position.

In operation 154, modular panel units are coupled to the keyed backing panel to form the predetermined pattern. The coupling may be achieved by pressing or pushing each of the modular panel units against a position in a proper orientation such that the connection features of the keyed backing panel engages a corresponding connector of the modular panel unit.

In some approaches, positions may be occupied by structures other than modular panel units, such as name badges, logo pieces, contact information placards, etc. In other approaches, some of the modular panel units may be adapted to have a name or some other information displayed thereon.

While various embodiments have been described above, it should be understood that they have been presented by way of example only, and not limitation. Thus, the breadth and scope of an embodiment of the present invention should not be limited by any of the above-described exemplary embodiments, but should be defined only in accordance with the following claims and their equivalents.

What is claimed is:

1. A system, comprising:
a keyed backing panel comprising a plurality of positions, each position comprising two or more connection features oriented to cause a modular panel unit coupled thereto to only attach in one of a plurality of orientations to form a predetermined pattern, wherein at least two positions are configured to cause modular panel units to attach thereto in different orientations; and
at least one modular panel unit, the at least one modular panel unit comprising:
a major subunit configured to be secured to the keyed backing panel at any of the plurality of positions in only one of the plurality of orientations; and
at least one minor subunit;
wherein the major subunit comprises:
at least one connector configured to couple to a corresponding connection feature of the keyed backing panel in order to secure the major subunit to the keyed backing panel; and
one or more coupling features;
wherein each of the at least one minor subunit comprises:
one or more couplers configured to couple to the one or more coupling features of the major subunit in order to secure the at least one minor subunit to the major subunit.

2. The system as recited in claim 1, wherein the at least one major subunit comprises:
a lower portion having a square or rectangular outer profile; and
an upper portion having a triangular outer profile, the upper portion being supported by and bounded by the outer profile of the lower portion.

3. The system as recited in claim 2, wherein the lower portion comprises:
the at least one connector configured to couple to the corresponding connection feature of the keyed backing panel in one of the plurality of orientations; and
the one or more coupling features configured to couple to the one or more couplers of the at least one minor subunit.

4. The system as recited in claim 2, wherein the upper portion comprises a plurality of perforations therein, the perforations configured to allow airflow through the upper portion.

5. The system as recited in claim 2, wherein the modular panel unit comprises one minor subunit, the minor subunit comprising:
a triangular outer profile bounded by the outer profile of the lower portion of the major subunit opposite the upper portion of the major subunit; and
a pattern of slats separated by slots, the slots being configured to allow airflow through the slots and the slats being configured to restrict access therethrough.

6. The system as recited in claim 1, wherein the major subunit comprises two or more connectors, and wherein the connectors are distributed along edges of the major subunit such that the major subunit is capable of being secured to the keyed backing panel in only one of the plurality of orientations at any of the plurality of positions on the keyed backing panel.

7. The system as recited in claim 1, wherein the at least one connector of the major subunit comprises a flexible, notched tip which is configured to flex into a position which resists removal from the keyed backing panel when inserted into a corresponding hole of the keyed backing panel.

8. The system as recited in claim 1, wherein each of the minor subunits is configured to be pushed onto the major subunit to establish a coupling therebetween, and wherein the major subunit is configured to be pushed onto the keyed backing panel to establish a coupling therebetween in only one of the plurality of orientations at any of the plurality of positions of the keyed backing panel.

9. A system, comprising:
- a keyed backing panel comprising a plurality of positions, each position comprising one or more connection features oriented to cause a modular panel unit coupled thereto to only attach in one of a plurality of orientations to form a predetermined pattern, each position having a predetermined orientation that forms the predetermined pattern after a plurality of modular panel units are secured to the plurality of positions; and
- the plurality of modular panel units configured to couple to the keyed backing panel, each modular panel unit comprising:
    - a major subunit configured to be secured to the keyed backing panel at any of the plurality of positions in only one of the plurality of orientations predetermined by each position;
    - and at least one minor subunit,
    - wherein the major subunit comprises:
        - at least one connector configured to couple to a corresponding connection feature of the keyed backing panel in order to secure the major subunit to the keyed backing panel; and
        - one or more coupling features;
    - wherein each of the at least one minor subunit comprises one or more couplers configured to couple to the one or more coupling features of the major subunit in order to secure the at least one minor subunit to the major subunit.

10. The system as recited in claim 9, wherein each of the major subunits comprise:
- a lower portion having a square or rectangular outer profile; and
- an upper portion having a triangular outer profile, the upper portion being supported by and bounded by the outer profile of the lower portion.

11. The system as recited in claim 10, wherein the lower portion comprises:
- the at least one connector adapted for coupling to the corresponding connection feature of the keyed backing panel in one of the plurality of orientations; and
- the one or more coupling features adapted for coupling to the one or more couplers of the at least one minor subunit.

12. The system as recited in claim 10, wherein the upper portion comprises a plurality of perforations therein, the perforations configured to allow airflow through the upper portion.

13. The system as recited in claim 10, wherein the minor subunits each comprise:
- a triangular outer profile bounded by the outer profile of the lower portion of the major subunit opposite the upper portion of the major subunit; and
- a pattern of slats separated by slots, the slots being configured to allow airflow through the slots and the slats being configured to restrict access therethrough.

14. The system as recited in claim 9, wherein each of the major subunits comprises two or more connectors, and wherein the connectors are distributed along edges of each of the major subunits such that the major subunits are capable of being secured to the keyed backing panel in only one of the plurality of orientations at any of the plurality of positions on the keyed backing panel.

15. The system as recited in claim 9, wherein the at least one connector of each of the major subunits comprises a flexible, notched tip which when inserted into a corresponding hole of the keyed backing panel, flexes into a position which resists removal from the keyed backing panel.

16. The system as recited in claim 9, wherein the minor subunits are configured to be pushed onto major subunits to establish a coupling therebetween, and wherein the major subunits are configured to be pushed onto the keyed backing panel to establish a coupling therebetween in only one of the plurality of orientations at any of the plurality of positions of the keyed backing panel.

17. The system as recited in claim 9, wherein the keyed backing panel comprises:
- a planar or semi-planar portion comprising the plurality of connection features distributed thereacross;
- a plurality of voids located at positions capable of having a modular panel unit coupled thereto; and
- one or more features configured to secure the keyed backing panel to another structure.

18. The system as recited in claim 17, wherein the keyed backing panel further comprises cross supports provided across each void to provide lateral support to the keyed backing panel.

19. The system as recited in claim 9, wherein the keyed backing panel comprises aluminum and the modular panel units comprise thermoplastic.

20. A method for creating a patterned panel, the method comprising:
- creating or receiving a keyed backing panel having a plurality of positions capable of having a modular panel unit installed thereon in only one of a plurality of orientations, each position comprising at least one connection feature, wherein the connection features are oriented to cause major subunits of modular panel units coupled thereto to form a predetermined pattern; and
- coupling major subunits of modular panel units to the keyed backing panel to form the predetermined pattern, wherein each modular panel unit comprises:
    - a major subunit configured to secure to the keyed backing panel at any of the plurality of positions in only one of the plurality of orientations predetermined by each position, the major subunit comprising at least one connector configured to couple to a corresponding connection feature of the keyed backing panel in order to secure the major subunit to the keyed backing panel and one or more coupling features; and
    - at least one minor subunit comprising one or more couplers configured to couple to the one or more coupling features of the major subunit in order to secure the at least one minor subunit to the major subunit.

* * * * *